United States Patent
Edwards

(10) Patent No.: US 10,074,129 B2
(45) Date of Patent: *Sep. 11, 2018

(54) VIRTUAL REALITY SYSTEM INCLUDING SMART OBJECTS

(71) Applicant: Red Dot Square Solutions Limited, Bedford (GB)

(72) Inventor: Mark Edwards, Milton Keynes (GB)

(73) Assignee: RED DOT SQUARE SOLUTIONS LIMITED, Bedford (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/216,893

(22) Filed: Jul. 22, 2016

(65) Prior Publication Data

US 2016/0328790 A1 Nov. 10, 2016

Related U.S. Application Data

(63) Continuation of application No. 13/758,879, filed on Feb. 4, 2013, now Pat. No. 9,400,993, which is a
(Continued)

(51) Int. Cl.
| | |
|---|---|
| *G06Q 30/06* | (2012.01) |
| *G06Q 30/02* | (2012.01) |
| *G06F 3/0484* | (2013.01) |
| *G06F 3/0488* | (2013.01) |
| *G06F 17/50* | (2006.01) |

(52) U.S. Cl.
CPC ....... *G06Q 30/0643* (2013.01); *G06F 3/0488* (2013.01); *G06F 3/04842* (2013.01);
(Continued)

(58) Field of Classification Search
CPC .......................................... G06Q 30/06–30/08
(Continued)

(56) References Cited

U.S. PATENT DOCUMENTS

| | | |
|---|---|---|
| 5,360,971 A | 11/1994 | Kaufman et al. |
| 5,446,834 A | 8/1995 | Deering |

(Continued)

FOREIGN PATENT DOCUMENTS

| | | |
|---|---|---|
| EP | 1 087 618 | 3/2001 |
| EP | 1 501 036 | 1/2005 |

OTHER PUBLICATIONS

Players to watch: Web-based and hand-held device companies. Anonymous. Searcher; Medford8.4 (Apr. 2000): 34-36. Downloaded from ProQuestDirect on the Internet on Sep. 5, 2017, 8 pages.*

(Continued)

*Primary Examiner* — Ming Shui
(74) *Attorney, Agent, or Firm* — Foley & Lardner LLP

(57) ABSTRACT

Embodiments of the invention include a virtual reality system that includes an instrumented device used to present a virtual shopping environment to a simulation participant. The participant's interactions with the virtual shopping environment may be used to conduct market research into the consumer decision making process. The virtual shopping environment may include one or more smart objects configured to be responsive to participant interaction. The virtual shopping environment may recreate a real-world shopping environment.

20 Claims, 7 Drawing Sheets

Related U.S. Application Data continuation of application No. 12/518,620, filed as application No. PCT/IB2007/055346 on Dec. 29, 2007, now Pat. No. 8,370,207.

(60) Provisional application No. 60/932,964, filed on Dec. 30, 2006.

(52) U.S. Cl.
CPC ..... *G06F 17/5009* (2013.01); *G06Q 30/0201* (2013.01); *G06Q 30/0603* (2013.01)

(58) Field of Classification Search
USPC .............................................. 705/26.1–27.2
See application file for complete search history.

(56) References Cited

U.S. PATENT DOCUMENTS

| | | | |
|---|---|---|---|
| 6,026,376 | A | 2/2000 | Kenney |
| 6,744,436 | B1 | 6/2004 | Chirieleison, Jr. |
| 7,029,121 | B2 | 4/2006 | Edwards |
| 7,680,694 | B2 | 3/2010 | Glazer et al. |
| 8,370,207 | B2 | 2/2013 | Edwards |
| 2002/0040332 | A1 | 4/2002 | Maari |
| 2002/0169665 | A1 | 11/2002 | Hughes |
| 2003/0020755 | A1 | 1/2003 | Lemelson et al. |
| 2004/0153371 | A1 | 8/2004 | Razumov |
| 2004/0183749 | A1 | 9/2004 | Vertegaal |
| 2005/0261980 | A1 | 11/2005 | Hadi |
| 2006/0011716 | A1 | 1/2006 | Perkowski |
| 2007/0027733 | A1 | 2/2007 | Bolle et al. |
| 2007/0118437 | A1 | 5/2007 | Perrault |
| 2007/0265507 | A1 | 11/2007 | De Lemos |
| 2008/0065468 | A1 | 3/2008 | Berg et al. |

OTHER PUBLICATIONS

Burke, Raymond R. "Do you see what I see? The future of virtual shopping," Academy of Marketing Science. Journal. Greenvale: Fall 1997. vol. 25, Iss. 4; p. 352, downloaded from ProQuestDirect on the Internet on Jul. 28, 2012, 9 pages.
Ex Parte Quayle Action received for U.S. Appl. No. 12/518,620 dated Jul. 31, 2012 (5 pages).
Final Office Action received for U.S. Appl. No. 12/518,618 dated Aug. 14, 2012 (11 pages).
Final Office Action received in U.S. Appl. No. 12/518,618 dated Oct. 1, 2013 (14 pages).
International Preliminary Report on Patentability for International Application No. PCT/IB2007/055346 dated Jul. 9, 2009 (7 pages).
International Preliminary Report on Patentability for International Application No. PCT/IB2007/055347 dated Jun. 30, 2009 (6 pages).
International Preliminary Report on Patentability for International Application No. PCT/IB2007/055348 dated Jul. 9, 2009 (7 pages).
International Search Report and Written Opinion for International Application No. PCT/IB2007/055347 dated May 16, 2008 (8 pages).
International Search Report and Written Opinion for International Application PCT/IB2007/055346 dated May 16, 2008 (8 pages).
Non-final Office Action received for U.S. Appl. No. 12/518,618 dated Jan. 18, 2012 (10 pages).
Non-Final Office Action received for U.S. Appl. No. 12/518,618 dated Mar. 1, 2013 (16 pages).
Non-final Office Action received for U.S. Appl. No. 12/518,620 dated Feb. 23, 2012 (19 page).
Non-final Office Action received for U.S. Appl. No. 12/518,621 dated Mar. 2, 2012 (11 pages).
Non-Final Office Action received for U.S. Appl. No. 13/758,879 dated Jun. 24, 2015, 25 pages.
Notice of Allowance issued in U.S. Appl. No. 12/518,620 dated Sep. 18, 2012 (8 pages).
Notice of Allowance received for U.S. Appl. No. 12/518,621 dated Jul. 31, 2012.
Notice of Allowance received for U.S. Appl. No. 13/758,879 dated Mar. 28, 2016, 7 pages.
Seachrist, David, "Internet storefront software," Computing Canada. Willowdale: Jun 9, 1997. vol. 23, Iss. 12; p. 36, downloaded from ProQuestDirect on the Internet on Jul. 28, 2012, 8 pages.

\* cited by examiner

VIRTUAL REALITY SYSTEM INCLUDING SMART OBJECTS

CROSS-REFERENCE TO RELATED PATENT APPLICATIONS

This application is a Continuation of U.S. patent application Ser. No. 13/758,879, filed Feb. 4, 2013, which is a Continuation of U.S. patent application Ser. No. 12/518,620, filed Jan. 19, 2010, which is a National Stage application of International Application No. PCT/IB2007/055346, filed Dec. 29, 2007, which claims priority to U.S. Provisional Patent Application No. 60/932,964, filed Dec. 30, 2006, the entire disclosures of which are incorporated by reference herein.

BACKGROUND

Field of the Invention

Embodiments of the present invention generally relate to methods and systems for generating virtual reality simulations used to simulate consumer shopping experiences as well as to methods for conducting market research and consumer product design using virtual reality simulations.

Description of the Related Art

The manufacture, marketing, and sales of consumer products is highly competitive. Product manufacturers and retailers spend enormous sums of money developing and testing products, product packaging, product placement, and store design. The essential endeavor of this type of consumer research is to attempt to understand what influences a consumer's purchasing decision, i.e., to answer the question "why?" a consumer purchases one product over another. One common approach to understanding consumer decision making is to conduct market research using questionnaires and focus groups. However, this approach is expensive and frequently ineffective. People often have difficulty articulating (or even understanding at a conscious level) what may drive their purchasing decisions. Thus, this approach is often of limited benefit.

Another approach to conducting consumer research is to use virtual reality simulations. Virtual reality tools may be used to generate a virtual reality simulation representing some real world action, process, or event. The virtual reality simulation may be configured to provide a simulated environment in which a user may interact with the simulated environment in real time. For example, a simulation may provide a visual representation of a retail store where the user may move through the simulated environment and "shop" for products. That is, the user may interact with the virtual environment to make purchasing decisions based on the user's own internal preferences, as well as on the selection and arrangement of products, as depicted by the virtual environment.

The more realistically the virtual reality simulation recreates the real-world shopping environment, then the more the user's choices and actions in the virtual environment may mimic those that would occur within a real world store. Accordingly, a well-constructed virtual reality simulation may provide a useful tool for researching what aspects of the corresponding real-world environment may influence a consumer purchasing decision.

SUMMARY

Embodiments of the invention include a virtual reality system that includes an instrumented device used to present a virtual shopping environment to a simulation participant.

One embodiment of the disclosure relates to a method of generating a virtual reality simulation of a shopping environment that includes generating, using a simulation system, one or more smart objects from a set of simulation data describing a shopping environment to be represented in the virtual reality simulation. Each smart object is a virtual representation of an object in the shopping environment. The method further includes generating, using the simulation system, the virtual reality simulation that includes the one or more smart objects. The method further includes presenting the virtual reality simulation to the simulation participant on a virtual reality display platform. The virtual reality display platform includes one or more touch screen display devices. The method further includes, each time the participant touches the one or more touch screen display devices on an area in which one of the smart objects is displayed, generating, using the simulation system, a touching record indicating that the participant touched the respective one of the smart objects. The method further includes storing each generated touching record in a memory.

Another embodiment of the disclosure relates to a computer-readable storage medium containing a program configured to create a virtual reality simulation. The program includes instructions for performing operations including generating one or more smart objects from a set of simulation data describing a shopping environment to be represented in the virtual reality simulation. Each smart object is a virtual representation of an object in the shopping environment. The operations further include generating the virtual reality simulation that includes the one or more smart objects and presenting the virtual reality simulation to the simulation participant on a virtual reality display platform. The virtual reality display platform includes one or more touch screen display devices. The operations further include, each time the participant touches the one or more touch screen display devices on an area in which one of the smart objects is displayed, generating a touching record indicating that the participant touched the respective one of the smart objects. The operations further include storing each generated touching record in a memory.

Another embodiment relates to a system including a virtual reality display platform. The virtual reality display platform includes at least one computing device and one or more touch screen display devices. The system further includes a memory storing a virtual reality program. When executed by the at least one computing device, the virtual reality program is configured to cause the at least one computing device to generate one or more smart objects from a set of simulation data describing a shopping environment to be represented in a virtual reality simulation. Each smart object is a virtual representation of an object in the shopping environment. The virtual reality program is further configured to cause the at least one computing device to generate a virtual reality simulation that includes the one or more smart objects and to present the virtual reality simulation to the simulation participant on the one or more touch screen display devices of the virtual reality display platform. The virtual reality program is further configured to cause the at least one computing device to, each time the participant touches the one or more touch screen display devices on an area in which one of the smart objects is displayed, generate a touching record indicating that the participant touched the respective one of the smart objects and to store each generated touching record.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
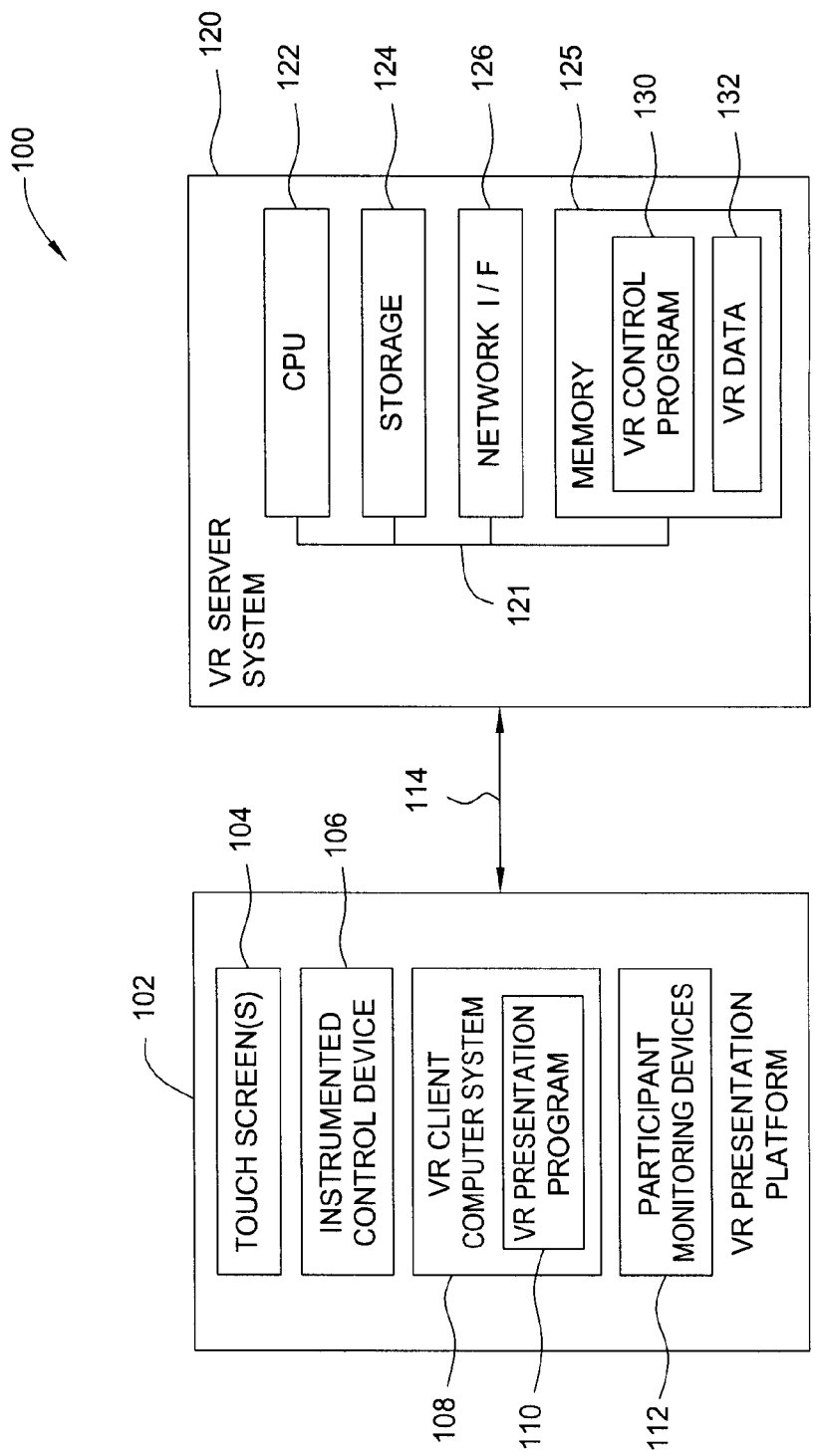
FIG. 1 is a diagram of a computing environment, according to one embodiment of the invention.

The description references embodiments of the invention. However, it should be understood that the invention is not limited to any specifically described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

One embodiment of the invention is implemented as a program product for use with a computer system. The program(s) of the program product defines functions of the embodiments (including the methods described herein) and can be contained on a variety of computer-readable media. Illustrative computer-readable media include, but are not limited to: (i) non-writable storage media on which information is permanently stored (e.g., read-only memory devices within a computer such as CD-ROM or DVD-ROM disks readable by a CD-ROM or DVD-ROM drive); (ii) writable storage media on which alterable information is stored (e.g., floppy disks within a diskette drive, hard-disk drives, or flash memory devices). Other media include communications media through which information is conveyed to a computer, such as through a computer or telephone network, including wireless communications networks. The latter embodiment specifically includes transmitting information to/from the Internet and other networks. Such computer-readable media, when carrying computer-readable instructions that direct the functions of the present invention, represent embodiments of the present invention.

In general, the routines executed to implement embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

Embodiments of the invention include a virtual reality system that includes one or more instrumented devices used to present a virtual shopping environment to a simulation participant. For example, the instrumented device may provide a handle having the general size shape and appearance of a shopping cart. Further, a participant may use the handle to navigate through the virtual shopping environment. The participant's interactions with the virtual shopping environment may be used to conduct market research into the consumer decision making process. For example, the simulation participant may be presented with a representation of consumer products on store shelves that corresponds to how the products appear within a real-world store. The simulation may allow the user to navigate through the virtual shopping environment with the instrumented device. In this way, the role of physical motion of the participant relative to the virtual reality environment and the significance of physical location, size, and shape of objects (e.g., retail products and product packaging) may be better simulated than using a simple animation or video sequence. In one embodiment, the instrumented device may model a shopping cart. In such a case, the instrumented device may include a handle operated by a simulation participant. By pushing the handle forward, back, left, right, etc., the user may "move" a virtual representation of a shopping cart through the virtual shopping environment (e.g., a retail store). The instrumented device may also include a set of display screens, including touch sensitive display screens, used to present the virtual shopping environment to the participant.

Further, the virtual shopping environment may be interactive and responsive to user actions. In one embodiment, the virtual reality simulation may be presented to the participant using a software application that includes a collection of "smart objects." The smart objects may provide programmatic elements configured to respond to the user's interaction with the simulated environment, as well as to have information recorded related to each interaction. For example, the fact that the user viewed the smart object (e.g., looked at the object or touched the object on a display screen) may be recorded, or information such as how long the user looked at the object and what the user may have viewed before or after looking at the smart object may be recorded. Other examples include the smart object capturing the fact that an object was examined, or what aspects of the product packaging were viewed by the participant (e.g., a nutritional label of a food item). Further, although a package or product may be presented in the virtual reality simulation as a single element, multiple smart objects may be used to record information about the interaction between the participant and that object. For example, a package of disposable diapers may include smart objects representing each of the product label, violator, package color, etc. More generally, the smart object may be configured to capture information related to interactions between the participant and the smart objects as well interactions between the participant and other elements of the virtual environment. In one embodiment, smart objects may be used to represent real-world elements of a retail shopping environment such as floors, shelves, signs, and products. By representing elements of the virtual shopping environment using smart objects, a wealth of data may be collected regarding the consumer's interaction with the virtual shopping environment.

In one embodiment, eye-tracking may be used to collect a variety of additional data from the user's interactions with the virtual shopping environment. As stated, people often have difficulty articulating (or even understanding at a conscious level) what may drive their purchasing decisions. To address this issue, eye-tracking may be used to determine what actually held a user's attention while interacting with the virtual shopping environment, as opposed to the user's recollection of what held their attention after the fact. For example, eye-tracking tools may be used to record what smart objects, e.g., floors, shelves, signs, and products, attracted (or failed to attract) a user's attention in the virtual environment. Additionally, the virtual reality system may be configured to generate a visualization that represents the path of a user's gaze during the virtual shopping simulation. By combining this information collected from many participants (or for one participant through many variations of the virtual shopping environment) valuable insights may be gained regarding what aspects of product design, placement, packaging, or signage may be effective approach for influencing consumer purchasing decisions.

Further, embodiments of the invention may be used to reduce the "degrees of separation" between the virtual environment and the corresponding real-world location. For example, the virtual shopping environment may be generated in part using planogram data, computer aided design (CAD) drawings, store layout data, product data, sales data, etc. Thus, the virtual shopping environment may accurately represent a corresponding real-world shopping location. By representing the shopping environment using virtual reality many different scenarios for store layout may be tested with a group of study participants.

Additionally, the virtual shopping environment may be tailored based on information received from a study participant. Different products, as represented by smart objects, may be added to (or removed from) the virtual shopping environment based on user feedback. By tailoring other smart objects within the virtual shopping environment to resemble features of the preferred product, the researcher may learn what aspects of product packaging, color, size, placement, etc, may influence the consumer purchasing decision. Thus, embodiments of the invention allow the researcher to use the virtual shopping environment to recreate a variety of real-world environments to explore a variety of different scenarios. Doing the same type of study in the real-world is simply impractical, as restocking and rearranging, the floors, shelves, products, signs and store layout for each research participant (or even one research participant) would require significant amounts of time and resources.

Further still, once a simulation is completed, the participant may again provide information about their experience in virtual shopping environment. This may lead to modifications of the virtual reality simulation, as well as to changes in product design, packaging, placement and store layout. Because the immersive virtual environment may provide a very accurate representation of an actual shopping environment, the participant's behavior may reflect what would occur in a real-world store. Thus, the quality of market research data obtained from the simulation may be greatly enhanced.

Further still, the quality of research data related to purchasing decisions may also be improved by incentivizing research participants. For example, a participant may be provided with a stipend used to purchase real products from within the virtual shopping environment. In such a case, the virtual shopping environment may closely mimic the layout, stock, and inventory of a real store. By allowing users to make real purchasing decisions within the virtual shopping environment, the quality of the research may be improved. Additionally, because the virtual shopping environment may be easily modified, many different scenarios for store layout, stock, and inventory, product placement, packaging, signage, etc., may be simulated.

Each smart object may play a role in obtaining and collecting data about the interactions of the user with the shopping environment. Further, interactions may be identified between different objects, including different classes of objects (e.g., a product on a shelf versus the floor). For example, a smart floor in the fully integrated system of smart objects of the present invention can provide data about where the participant traveled within the virtual store, where the user stood while viewing an object, how the user moved after first spotting an object such as a product of interest, how long the user stood still when examining an object, when the user first began moving after looking away from an object, which new object (e.g., a different product), etc. In one embodiment, data collected from a plurality of users may be used to obtain statistics comparing a relationship between product placement and graphics to user dwell time in the virtual environment near those objects, and to determine which locations in an aisle or physical aisle configurations are effective in drawing the attention of user to a particular group of products or to increasing the likelihood of purchasing a target product or product from a particular product class.

Related information can be obtained from smart shelves that record gaze time for a shelf (in addition to recorded gaze times for individual products). Studies may explore how, for a given group of products in a shelf, shelf location in an aisle or the proximity of other shelves and products affects user interaction with the shelf. Smart objects representing store shelves may also be used to examine user attention to promotional materials associated with a shelf, such as a coupon dispenser, graphics panel, flashing light, etc. Similarly, smart objects may be used to represent other elements of the store depicted in the virtual reality environment, e.g., a smart object may represent a call button used to summon a store employee to a given department. By generating different simulations with the call button at different locations, a preferred position for the button may be determined. As another example, the virtual reality simulation may also include representations of store employees or other individuals shopping within the virtual environment. In such a case, a smart object may be used to represent a small child, and the simulation may be used to evaluate whether a store display (represented by another smart object) placed at a particular location may tend to distract the participant. In this way, safety characteristics may be evaluated be used to predict when a display position/location could create a greater risk of a collision.

The interaction of individual products, using data obtained from the corresponding smart objects, can be used to obtain cross-marketing data for marketing research, such as the tendency for prior interaction with one product to affect subsequent interaction of a second product. The interactions may include viewing the object beyond a predetermined length of time, physically picking up the object, noticing a violator on the product packaging, or making a purchase decision (e.g., putting the object in the cart). Such interactions may increase or decrease user interest in a subsequently encountered object, and this interaction may be affected by proximity of the objects, aisle design, order in which the objects are encountered, etc. Information on such interactions may be used to further optimize product graphics, planogram designs, aisle design, ambient lighting, etc.

FIG. 1 is a diagram of a computing environment 100, according to one embodiment of the invention. As shown, computing environment 100 includes a virtual reality presentation platform 102 and a virtual reality server system 120. Further, virtual reality presentation platform 102 includes a client computer system 108 executing a virtual reality presentation program 110. Client computer system 108 may be configured to communicate with virtual reality server system 120 over a network 114 (represented by an arrow). The computer systems 108 and 120 illustrated in environment 100 are included to be representative of existing computer systems, e.g., desktop computers, server computers, laptop computers, tablet computers and the like. However, embodiments of the invention are not limited to any particular computing system, application, device, or network architecture and instead, may be adapted to take advantage of new computing systems and platforms as they become available. Additionally, those skilled in the art will recognize that the illustrations of computer systems 108 and 120 are simplified to highlight aspects of the present invention and that computing systems and networks typically include a variety of components not shown in FIG. 1.

In one embodiment, virtual reality presentation program 110 may be configured to present the virtual shopping environment to a simulation participant and respond to interaction with the environment. Depending on the configuration of platform 102, the participant may interact with the virtual shopping environment in a variety of ways. Illustratively, virtual reality presentation platform 102 includes one or more touch screens 104, an instrumented control device 106, and one or more participant monitoring devices 112. The touch screens 104 may be arranged to present a panoramic view of the virtual reality simulation, i.e., a view that extends beyond the participant's peripheral vision. Additionally, presentation program 110 may be configured to respond to the participant touching smart objects displayed on touch screens 104. As described in greater detail with respect to FIG. 2, below, each smart object may be a programmatic object configured to respond to user interaction as part of the virtual reality simulation and to record information regarding each such interaction. Smart objects may link to or call the software routines used to represent elements of interest within the virtual shopping environment. Thus, smart objects may include objects representing floor objects, fixture objects, sign objects, and product objects within the virtual shopping environment. For example, the participant may make a purchasing decision by touching a product displayed on touch screen 102. In response, the smart object representing such a product may record that the user selected it, along with other contemporaneous information regarding the interaction. The instrumented control device 106 may allow the participant to "move" through the virtual shopping environment. In one embodiment, instrumented control device 106 may be a gripping member configured to represent, e.g., a handle from a shopping cart connected to a control device, allowing presentation program 110 to move the participant through the virtual shopping environment based on the direction which the participant pushes or turns the handle.

In addition to the programmatic smart objects included in presentation program 110, presentation platform 102 may include one or more participant monitoring devices 112. For example, in one embodiment, monitoring devices 112 may include an eye-tracking device configured to monitor the objects on display screens 104 viewed by the participant. The eye-tracking information may be provided to presentation program 110. In turn, the smart objects being viewed may record information reflecting that the participant viewed a given object. By recording this information over time, the path of the participant's gaze may be captured and played back to a researcher, product manufacturer/purchaser, retailer or other relevant party. Such visualizations may be used to identify "hot spots" within the virtual shopping environment, i.e., elements of the environment that attracted the attention of one or more participants, as reflected by the monitored eye movements of such participants. Additionally, other physical responses of the participant may be recorded to evaluate an overall emotional reaction a given participant has to elements of the virtual shopping environment. For example, to determine whether someone is offended by provocative literature presented at a checkout stand. In one embodiment, in addition to an eye-tracking system, the appropriate monitoring devices 112 could monitor a participant's respiration, blood pressure, pulse, galvanic skin response, body motion, muscle tension, etc. For example, the instrumented device 106 could include a sensor configured to monitor the heart rate of a participant. In such a case, once the simulation was completed, the heart rate and eye-tracking data could be correlated with one another.

Exemplary eye-tracking systems believed to be suitable for use with the system of the present invention include the "EyeTools" system of EyeTools, Inc. (San Francisco, Calif.), a system designed for marketing research that can be used, for example, to track a research participant's responses to Internet web pages. Other systems include One Glance® system of EyeTech Digital Systems (Mesa, Ariz.) and the portable MyTobii eye control system of Tobii Technology (Stockholm, Sweden). Of course, other eye-tracking systems may be used.

Generally, these (or other) eye tracking systems include one or more small camera systems that track eye motions of the research participant and determine the portions of the display screens 104 that are being viewed at any given moment. The information may be transmitted to computer system 120 and presentation program 130 where it can be associated with information about what is being displayed on the graphic displays.

As shown, server system 120 includes CPUs 122, storage 124, a network interface 126, and a memory 125 connected by a bus 121. CPU 122 is a programmable logic device that executes the instructions, logic and mathematical processing performed in executing user applications (e.g., a virtual reality control program 130). Storage 124 stores application programs and data for use by server system 120. Common storage devices 124 include hard-disk drives, flash memory devices, optical media and the like. Network interface 126 allows server system 120 communicate with client computer system 108 using any kind of communications network, including both wired and wireless networks. Accordingly, network 114 is representative of both local and wide area networks, including the Internet. Illustratively, memory 125 includes virtual reality control program 130 and virtual reality data 132. Virtual reality control program 130 may provide a software application configured to generate a virtual reality simulation that includes virtual reality data 132. For example, virtual reality data 132 may include planogram data (i.e., a diagram, drawing, or other description of a store's layout, including placement of particular products and product categories), computer aided design (CAD) drawings, store layout data, product data sales data, etc. In one embodiment, control program 130 may be configured to generate smart objects from virtual reality data 132 and generate a virtual reality simulation presented to a participant using presentation program 110. Additionally, virtual reality data 132 may include information received from presentation program 110 regarding how a given participant interacts with the virtual shopping environment (and smart objects) presented to that participant on presentation platform 102.

Figure 2:
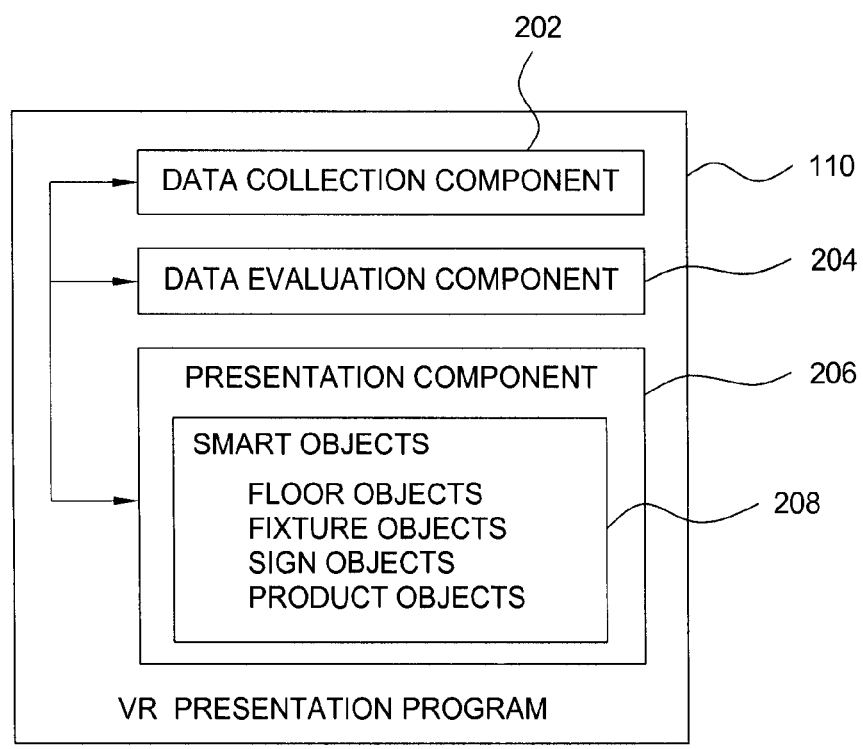
FIG. 2 is a diagram further illustrating elements of the computing environment first shown in FIG. 1, according to one embodiment of the invention.

FIG. 2 is a diagram further illustrating the virtual reality presentation program 110 shown in FIG. 1, according to one embodiment of the invention. As shown, presentation program 110 includes a data collection component 202, a data evaluation component 204, and a presentation component 206. The illustration of presentation program 110 is simplified to highlight aspects of the present invention. Software applications (e.g., presentation program 110) typically include a variety of components and data structures not shown in FIG. 1, but readily recognized by a person of ordinary skill in the art having the benefit of the present disclosure.

The data collection component 202 may provide software routines used to receive and process input to presentation program 110. For example, data collection component 202 may receive information from monitoring devices 112 such as eye-tracking data indicating what the participant is looking at throughout the simulation. Further, this information may be passed to the appropriate smart object 208. Data evaluation component 204 may provide software routines used to analyze the data captured from a given simulation. In one embodiment, data evaluation component 204 may be configured to generate a visualization of the eye-tracking data collected for a given participant. The visualization may simulate a camera moving through the retail store, focused on what was viewed by the participant during the simulation. In another case, a point representing the users focus could be displayed and used to draw lines representing the path of the participant's gaze on an image of the retail shopping environment. Similarly, data evaluation component 204 may be configured to process data regarding a particular participant in order to customize what smart objects are present and/or active within the virtual shopping environment. Smart objects 208 provide the software routines used to represent elements of interest within the virtual shopping environment. Illustratively, smart objects 208 include floor objects, fixture objects, sign objects, and product objects. In one embodiment, smart objects 208 may be configured to respond to the participant's interaction with the virtual shopping environment, as well as to record data related to each interaction. For example, a smart object 208 may record the fact that the user viewed the smart object 208 (e.g., looked at the object or touched the object on a display screen) or record information such as how long the user looked at one of the smart objects 208.

Figure 3:
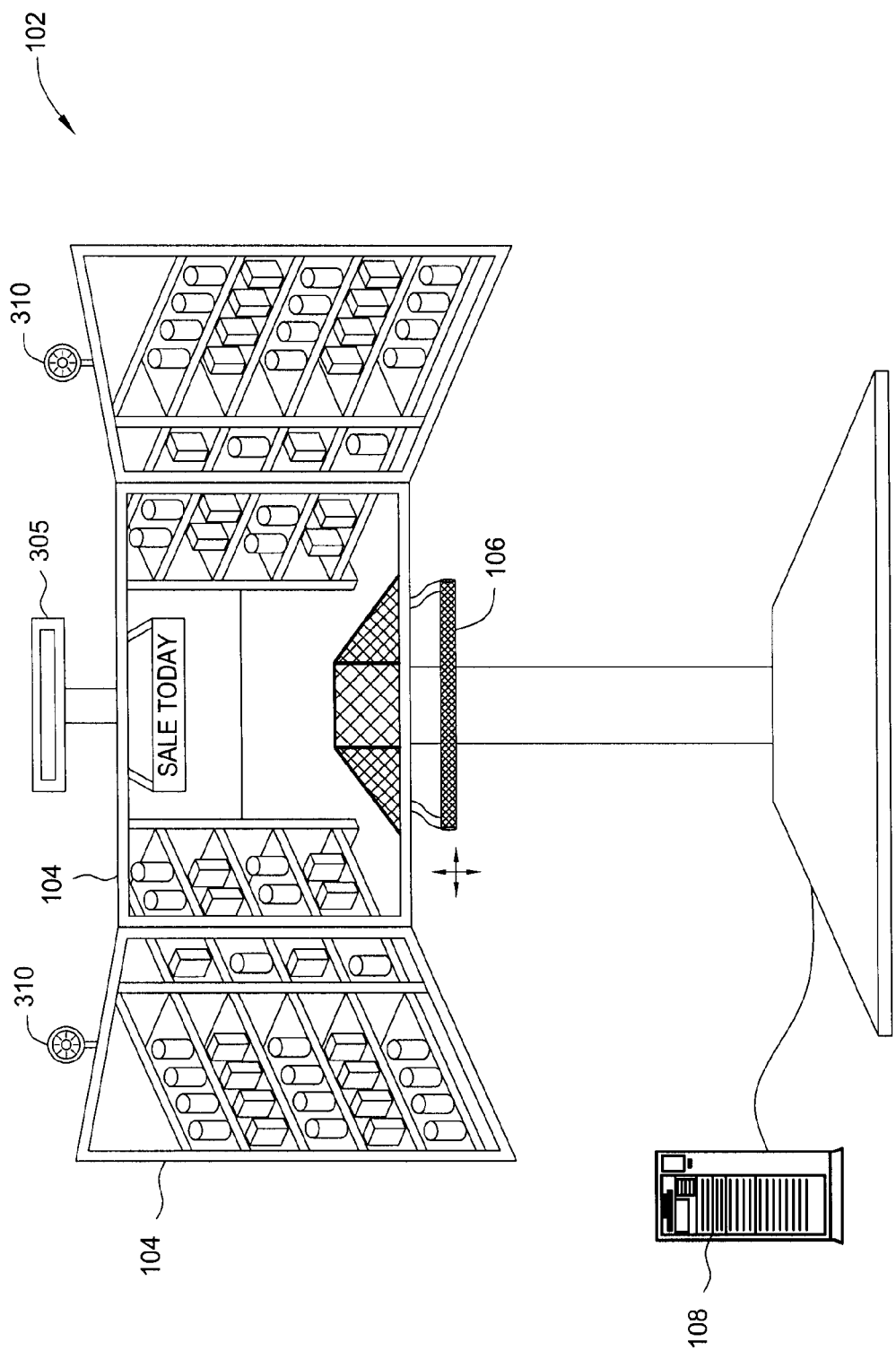
FIG. 3 is an illustration of a configuration of a virtual reality display platform, according to one embodiment of the invention.

FIG. 3 is an illustration of a configuration of virtual reality display platform 102, according to one embodiment of the invention. Illustratively, virtual reality display platform 102 includes three touch screens 104 arranged to present a simulation participant with a panoramic view of the virtual shopping environment. Instrumented control device 106 may allow a simulation participant to navigate through the virtual shopping environment. For example, to move forward, the user may push the instrumented control device 106 forward, causing the virtual reality presentation program 110 to generate and display images on display screens 104, creating an illusion that the participant is walking through an aisle of a retail store. Pushing the instrumented control device 106 in other directions causes the virtual reality presentation program 110 to respond appropriately. Additionally, as the participant navigates through the virtual shopping environment, different smart objects 208 move into (and out of) view. As a given smart object 208 comes into view, presentation program 110 may be configured to display the smart object on touch screens 104. While on screen, if viewed by the participant, or selected (e.g., by touching touch screen 104), the smart object 208 may capture details regarding the participant's interaction. Eye-tracking device 305 may record what area of the touch screens 104 the user views at any given point in time, thus capturing the path of the participant's gaze through the virtual shopping environment. For example, eye-tracking device 305 may be configured to track movements of a participant's retina or pupil in viewing elements of the virtual reality simulation. Further, once trained, the eye-tracking device 305 is relatively non-obtrusive and subtle. As the user's gaze changes from one object in the virtual reality simulation to another, eye-tracking system may transmit eye-tracking data to computer system 108.

In one embodiment, in addition to the visual component displayed on touch screens 104, the virtual shopping environment may include an audio component. As shown, virtual reality display platform may include a set of audio speakers 310. For example, the audio component may include sounds mimicking a shopping cart as the user pushes on the instrumented device 106 along with sounds representing other people appropriate to the a real-world store represented in the virtual shopping environment. As another example, the audio component could include the sounds of a crying baby shown in a shopping cart on display screen 104. Doing so may be used to evaluate the impact of distractions on consumer purchasing decisions. Similarly, scents may be introduced to further increase the realistic quality of the virtual reality simulation. For example, a scent characteristic of baking bread may be introduced in increasing amounts as a user approaches a bakery section of a virtual shopping environment. Another example would include introducing a strongly scented cleaning product used to maintain store cleanliness into the virtual shopping environment and then evaluating how the presence of such a scent may impact consumer shopping patterns. Additionally, haptic interfaces may be used to simulate other sensory or perceptual aspects of the virtual shopping environment, e.g., example, haptic gloves, touch-simulating pads, etc. In such cases, smart objects may be associated with tactile properties—texture, mass, etc., of objects simulated by the virtual shopping environment.

Figure 4:
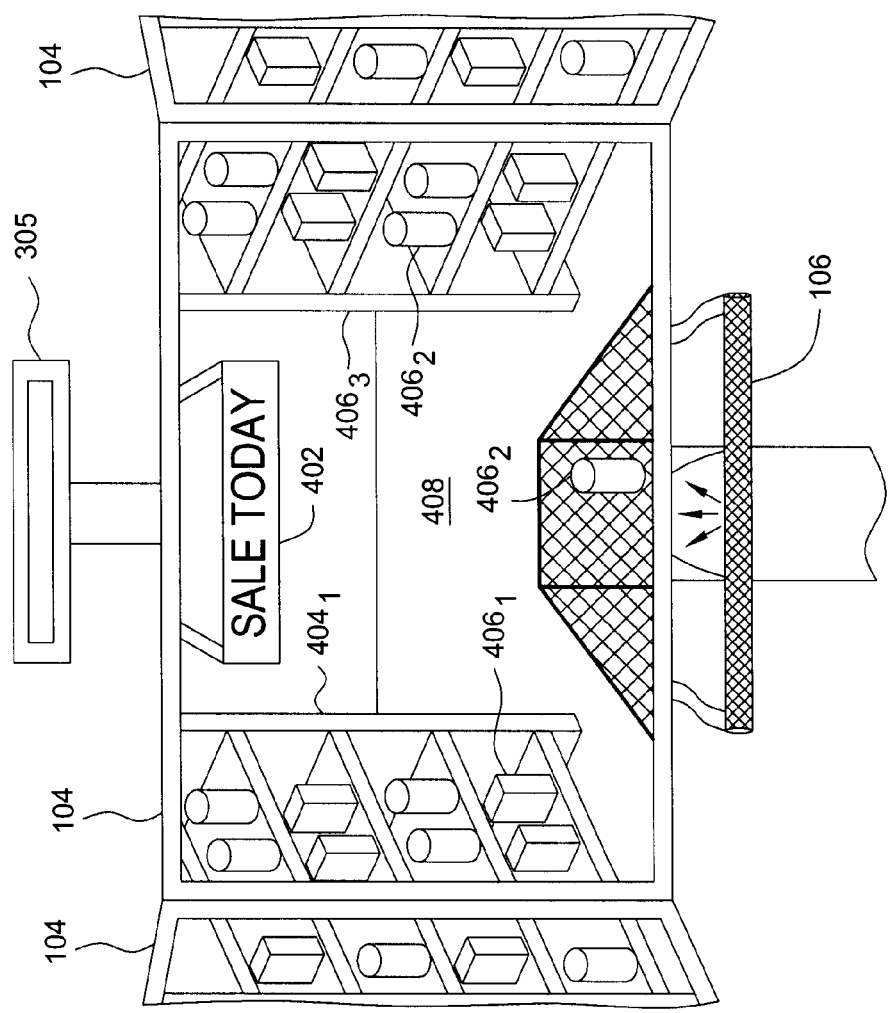
FIG. 4 further illustrates the virtual reality display platform of FIG. 3, according to one embodiment of the invention.

FIG. 4 further illustrates the virtual reality display platform of FIG. 3, according to one embodiment of the invention. FIG. 4 shows a detailed view of touch screens 104. In this example, touch screens 104 display a virtual shopping environment that includes a sign 402, a first shelf $404_1$ and a second shelf $404_2$; on the shelves are products $406_1$ and $406_3$. Illustratively, virtual shopping cart 410 includes a product $406_2$ selected for purchase by the participant. Aisle floor 408 represents the particular aisle of the virtual shopping environment on which the participant is currently located. Each of sign 402, shelves 404, products 406 and aisle floor 408 may be a visual representation of a smart object 208. Accordingly, as the participant navigates through the virtual shopping environment depicted in FIG. 4, sign 402, shelves 404, products 406 and aisle floor 408 may be configured to record information related to the participant's interaction with the respective elements of the virtual shopping environment.

Figure 5:
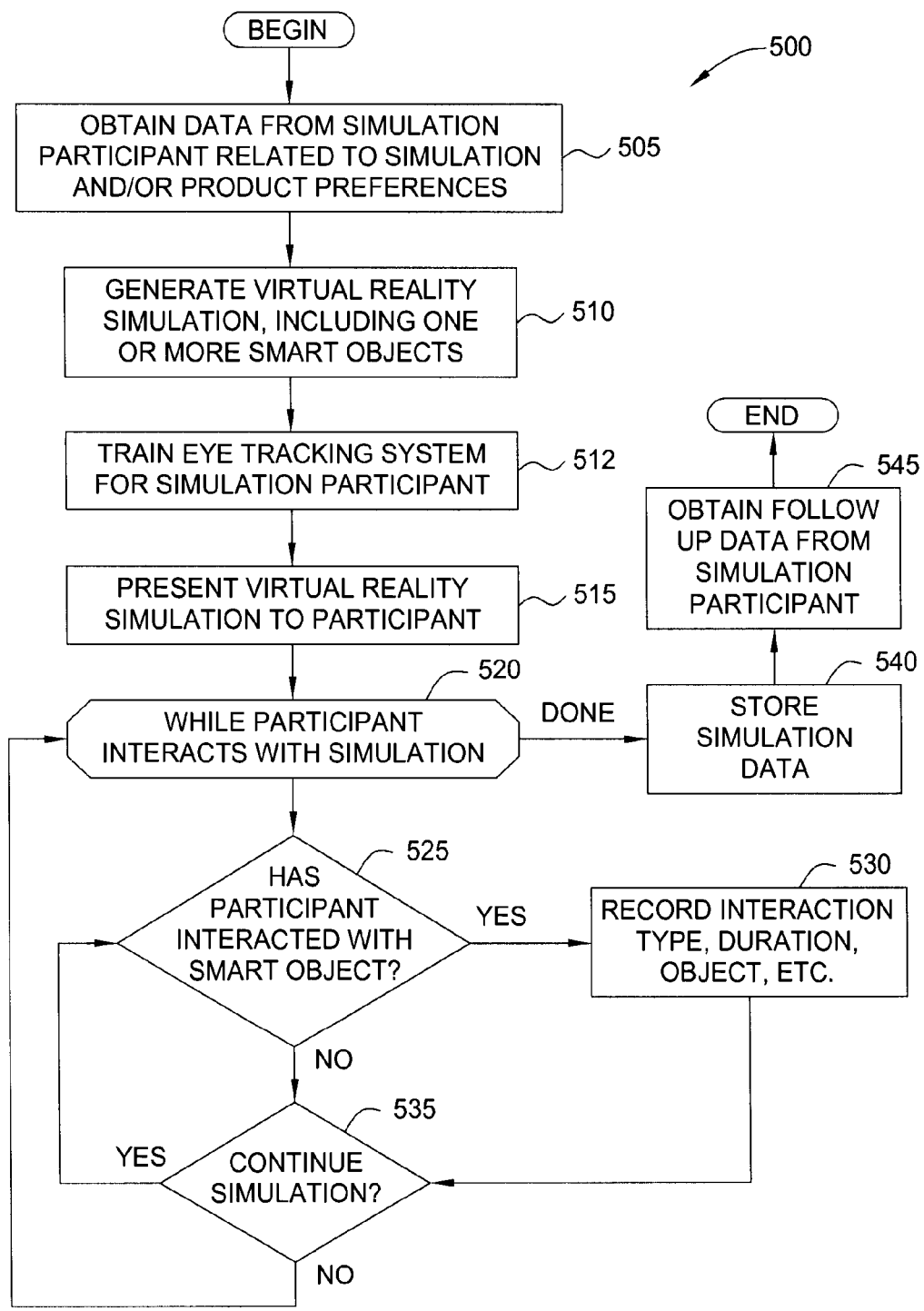
FIG. 5 is a flow chart illustrating a method for presenting a simulation participant with a virtual shopping environment, according to one embodiment of the invention.

FIG. 5 is a flow chart illustrating a method 500 for presenting a simulation participant with a virtual shopping environment, according to one embodiment of the invention. As shown, method 500 begins at step 505 where a simulation participant may provide information regarding their own product preferences or tastes. This information may be used to select and/or customize the smart objects or other content of the virtual shopping environment. At step 510, the virtual reality control program 130 may generate the virtual shopping environment based on the preferences provided at step 505. Of course, in another embodiment, steps 505 and 510 may be omitted from method 500. For example, a relevant party may have generated a virtual shopping environment corresponding to a real-world store. In such a case, the virtual shopping environment may be presented to a plurality of simulation participants to evaluate how the participants react to some aspect of the virtual environment without the need for any up-front information provided by a given participant.

At step 512, the participant may train the eye-tracking system 305 to recognize their eye movements. For example, the touch screens 104 may display target points viewed by the participant at different positions of the screens. By having the participant view a set of predetermined target points in a particular sequence, the eye-tracking system 305 may then accurately determine what location on touch screen 104 the participant happens to be viewing at any given time. At step 515, the virtual shopping environment is presented to a simulation participant. At step 520, a loop begins where the user navigates through the virtual shopping environment using an instrumented device and interacts with elements of the simulation (e.g., makes purchasing decisions). At step 525, the virtual reality presentation program may determine whether the participant has interacted with a smart object. If not, then at step 535, while the participant continues to interact with the virtual shopping environment, the method returns to step 525. Once the participant interacts with a smart object, then at step 530, the relevant smart object may record information related to the interaction (e.g., type, duration, etc).

At step 540, once the participant concludes the simulation, the simulation data collected by the smart objects may be stored (e.g., as part of virtual reality data 132). As described above, this information may be used for a variety of research purposes as well as to generate visualizations of the participant's simulation experience. Optionally, at step 545, the participant may be prompted to provide data regarding their simulation experience.

Figure 6:
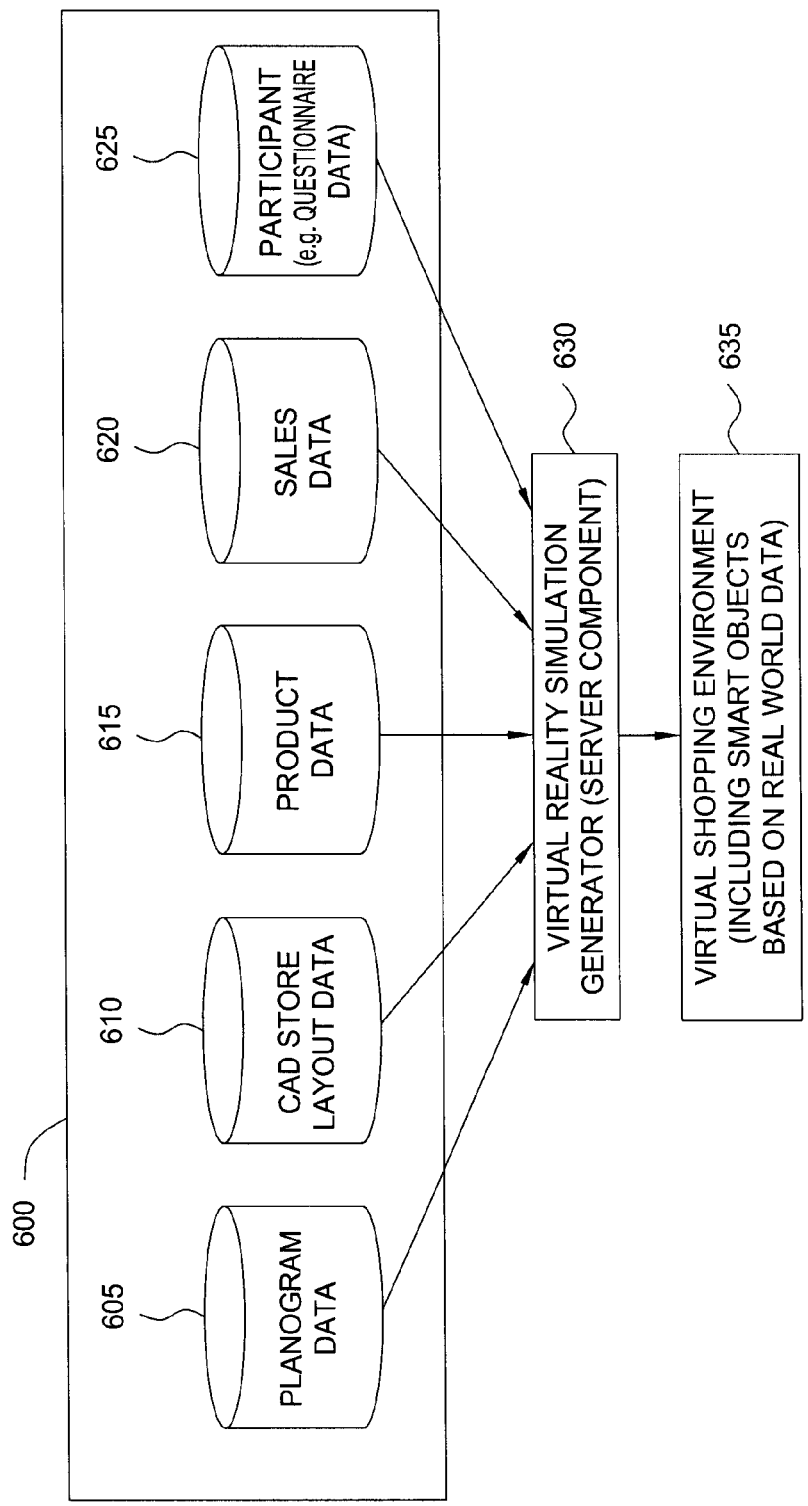
FIG. 6 is an illustration of a plurality of data sources used to generate a virtual shopping environment, according to one embodiment of the invention.

FIG. 6 is an illustration of a plurality of data sources used to generate a virtual shopping environment, according to one embodiment of the invention. As shown, data sources 600 include planogram data 605, CAD drawings and data 610, product data 605, sales data 620, and participant data 625. Planogram data 605 may provide diagrams, drawings, or other descriptions of the layout of shelves in a retail shopping environment, including, e.g., a store's layout, and the placement of particular products and/or product categories. Accordingly, planogram data 605 may be used to define the arrangement of store shelves within the virtual shopping environment, as well as what products may appear in each section or shelf. CAD drawings and data 610 may provide a layout model for the virtual shopping environment. In one embodiment, CAD drawings and data 610 may correspond to a real-world shopping environment modeled by the virtual shopping environment.

In addition to the position and arrangement of shelves, CAD drawings and data may include a variety of additional information related to the real-world store. For example, data related to signs, shopping carts, store colors, etc., may all be represented by data 610. Product data 615 and sales data 620 may include information related to the products stocked on the shelves of the virtual shopping environment. For example, product and sales data may specify the appearance of packaging, and the pricing and/or sales rates of products. This information may be used to generate product smart objects included in the virtual shopping environment mimicking that of the corresponding real-world objects. Additionally, sales data 620 may include information related to prices and sales rates of products to include in the virtual shopping environment. Such information may be used, for example, to depict products on a fully stocked shelf or create sign objects reflecting the price of a given product. Participant data 615 may include any information collected from a participant. For example, participant data 615 may include demographic information regarding the participant as well as answers provided to a questionnaire regarding a given participant's product preferences. Of course, depending on the particular virtual shopping environment the example data sources shown in FIG. 6, or other data sources, may be used to generate the virtual shopping environment.

In one embodiment, information from planogram data 605, CAD drawings and store data 610, product data 615, sales data 620, and participant data 625 may be supplied to a virtual reality simulation generator 630 (e.g., the virtual reality control component 130 of FIG. 1) which in turn may generate a virtual shopping environment 635. As described, the virtual shopping environment 635 may be presented to simulation participant on a virtual reality display platform, (e.g., the platform illustrated in FIGS. 1-4). Further, as described, the virtual shopping environment 635 may include a collection of smart objects configured to respond to the interaction of a participant.

Figure 7:
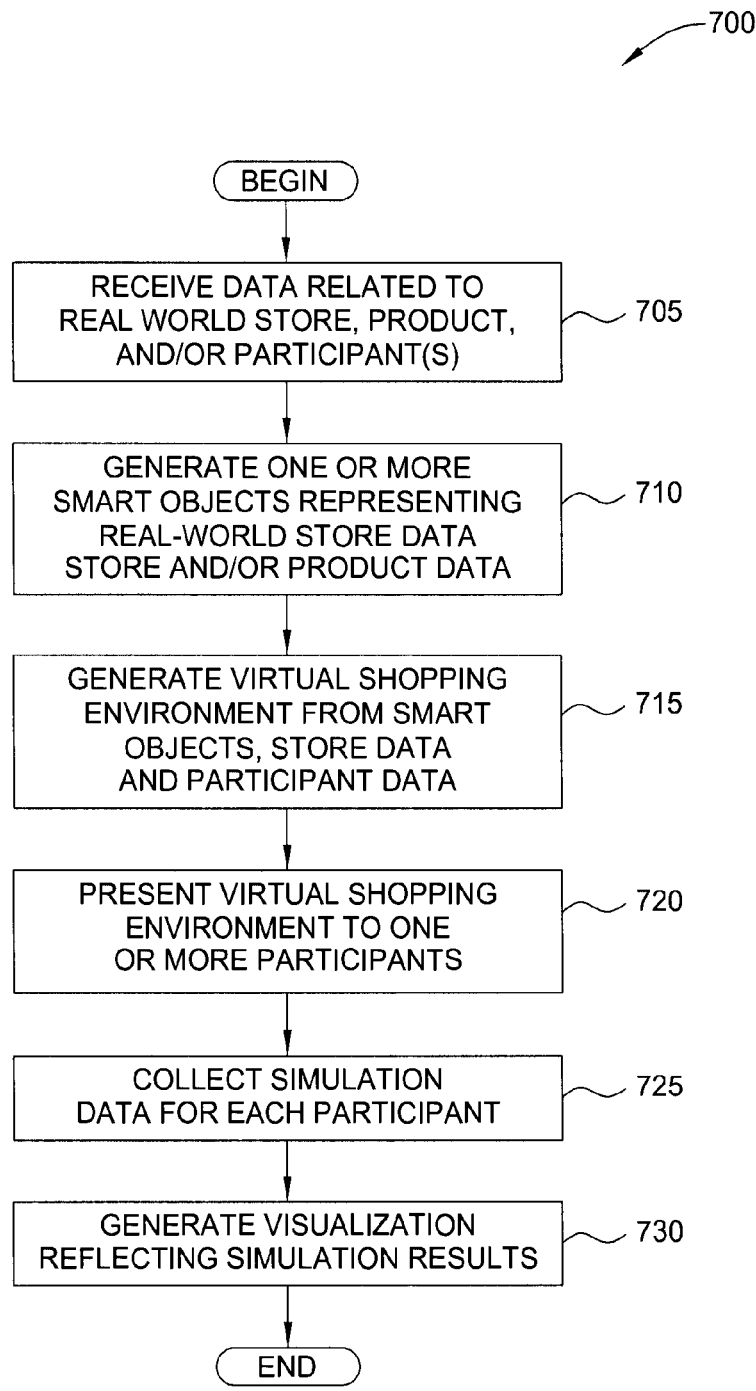
FIG. 7 is a flow chart illustrating a method for presenting a simulation participant with a virtual shopping environment, according to one embodiment of the invention.

FIG. 7 is a flow chart illustrating a method 700 for presenting a simulation participant with a virtual shopping environment, according to one embodiment of the invention. As shown, method 700 begins at step 705 where a virtual reality simulation generator (e.g., a virtual reality simulation generator 630) may receive a collection of data related to a real-world store, product. Further, the simulation generator may also receive data related to a particular simulation participant.

At step 710, one or more smart objects representing the real-world store and/or product data may be generated.

Further, the smart objects may be customized (or included or not included) based on data provided directly from the simulation participant. For example, prior to entering the virtual shopping environment, a user may have indicated a strong preference for a particular brand of shampoo. In such a case, the smart object corresponding to that brand could easily be removed from the virtual shopping environment. This allows a researcher to understand, given a stated "strong" preference for one brand, how long before the consumer turns to another brand and, further, to analyze what about the shopping environment may influence the consumer's selection of an alternative.

At step 715, the simulation generator may generate the virtual shopping environment based on the information received at step 705 and the smart objects generated at step 710. At step 720, the virtual shopping environment may be presented to one or more simulation participants on a display platform (e.g., the platform 102 illustrated in FIGS. 1-4). At step 725, the smart objects may collect simulation data for each participant that interacts with the virtual shopping environment. Once the participants have concluded their virtual shopping experience, as shown as step 730, the collected simulation data may be used to generate one or more visualizations (or other reports) describing how the participants interacted with different elements of the virtual shopping environment. These visualizations can include modification of the displayed virtual shopping environment to reflect the amount of time that participants spend gazing at particular objects. For example, "hot spots" of visual attention may be recolored or have a colored cloud (optionally having a degree of opacity such as from 10% to 90% transparent) superimposed over the hot spots, with the extent of gazing (e.g., cumulative time spend gazing at the region) being represented in terms of the size, color, color intensity or opacity of the cloud, to provide a readily recognized graphical means of presenting eye gaze data on the display. Such data may also be displayed by any other known method, such as with numerical displays, etc. In addition to displaying time-averaged or cumulative results, time-dependent data may be displayed to indicate the paths that the eyes followed or the sequence of objects or locations viewed (e.g. color may be used to distinguish early versus late locations, or key locations may be labeled with data indicating statistical data regarding when the spot was viewed or its rank in a sequence of viewed locations, etc.). Such representations can be done for localized hot spots or for each viewed smart object as a whole. Thus, the modified display may include a graphical representation of a sequence of smart objects that were viewed, optionally including data or graphical displays representing the relative degree of attention received by the smart objects.

As described herein, embodiments of the invention may be used to generate virtual reality simulations used for market research and related activities. The virtual reality simulations may provide a realistic simulation of a shopping environment. In one embodiment, a virtual reality display platform may include an instrumented device representing, for example, a shopping cart. A virtual reality simulation may also include a collection of smart objects configured to respond to how the participant interacts with the virtual shopping environment and record information related thereto. Thus, the virtual shopping environment may be used to research consumer purchasing decisions, aspects of product design and or/packaging, etc. Additionally, the virtual shopping environment may accurately mimic the appearance design and layout of a real-world store. For example, real-world CAD drawings, product data, and other information regarding the real-world store may be used to generate the virtual shopping environment.

Further, the virtual reality simulations used for market research may be customized to conduct a broad variety of research related to consumer shopping and purchasing decisions. For example, the effects of different store clientele demographics may be researched, such as how the distribution of products between "high" and "low" end brands effects whether higher-income individuals are more (or less) less likely to shop in stores where the predominant cross section of goods are purchased by lower-income individuals. Similarly, the virtual reality simulation could present both the appearance of the store as well as the appearance of employees, including representations of employee dress, facial hair, tattoos, piercings, etc, and use different "appearance settings" to research the impact this has on consumer purchasing behavior. In such a case, the virtual reality simulation could be used to research whether a person is more (or less) willing to pay more for the same item in a more desirable shopping environment. Of course, these two examples provide only a couple useful scenarios, and many other variations will readily occur to one of ordinary skill in the art having the benefit of the present disclosure.

Advantageously, by generating a virtual reality simulation that includes an instrumented shopping cart, product designers and manufacturers may better optimize products and marketing approaches, without incurring the large expense of conducting extensive market research. Further, by employing techniques such as eye-tracking, the researcher may determine an accurate account of what attracted (or failed to attract) a user's attention in the virtual environment. For example, the virtual reality system may be configured to generate a visualization that represents the path of a user's gaze during the virtual shopping simulation. Thus, attention "hot spots" may quickly be identified. By combining data collected from many participants (or for one participant through many variations of the virtual shopping environment) valuable insights may be gained regarding what aspects of product design, placement, packaging, or signage may be effective approach for influencing consumer purchasing decisions.

While the foregoing is directed to embodiments of the present invention, other and further embodiments of the invention may be devised without departing from the basic scope thereof, and the scope thereof is determined by the claims that follow.

What is claimed is:

1. A method of generating a virtual reality simulation of a shopping environment, comprising:
    receiving, by the simulation system comprising one or more computing devices, a set of simulation data describing a shopping environment to represent in the virtual reality simulation;
    generating, by the simulation system and from the set of simulation data, one or more smart objects, wherein each smart object is a virtual representation of an object in the shopping environment;
    generating, by the simulation system, a virtual reality simulation that includes the one or more smart objects;
    presenting, by the simulation system, the virtual reality simulation to a simulation participant on a virtual reality display platform, the virtual reality display platform comprising one or more touch screen display devices;
    each time the participant touches the one or more touch screen display devices on an area in which one of the smart objects is displayed, generating, by the simulation system, a touching record indicating that the participant touched the respective one of the smart objects; and storing, by the simulation system, each generated touching record in a memory.

2. The method of claim 1, wherein each smart object represents one of a floor, a shelf, a sign, and a product within the shopping environment.

3. The method of claim 1, wherein one or more of the smart objects comprises a virtual representation of one or more products, and wherein the method further comprises interpreting touching records generated in response to touching associated with the one or more products as an indication that the participant has chosen to purchase the one or more products in the virtual reality simulation.

4. The method of claim 1, further comprising providing haptic feedback to the user in response to the touching records.

5. The method of claim 1, wherein the set of simulation data includes an indication of consumer product preferences provided by the participant, and wherein the one or more smart objects are generated in response to the consumer product preferences of the participant.

6. The method of claim 1, wherein the virtual reality display platform includes an instrumented device, and wherein the method further comprises receiving user input from the instrumented device and displaying images on the one or more touch screen display devices that are configured to simulate navigating through the shopping environment based on the user input.

7. The method of claim 6, wherein the instrumented device comprises a physical handle configured to simulate an appearance and function of at least a portion of a shopping cart.

8. A non-transitory computer-readable storage medium containing a program configured to create a virtual reality simulation, the program including instructions for performing an operation, comprising:

receiving a set of simulation data describing a shopping environment to represent in the virtual reality simulation;

generating, from the set of simulation data, one or more smart objects, wherein each smart object is a virtual representation of an object in the shopping;

generating a virtual reality simulation that includes the one or more smart objects;

presenting the virtual reality simulation to a simulation participant on a virtual reality display platform, the virtual reality display platform comprising one or more touch screen display devices;

each time the participant touches the one or more touch screen display devices on an area in which one of the smart objects is displayed, generating a touching record indicating that the participant touched the respective one of the smart objects; and storing each generated touching record in a memory.

9. The non-transitory computer-readable storage medium of claim 8, wherein each smart object represents one of a floor, a shelf, a sign, and a product within the shopping environment.

10. The non-transitory computer-readable storage medium of claim 8, wherein one or more of the smart objects comprises a virtual representation of one or more products, and wherein the method further comprises interpreting touching records generated in response to touching associated with the one or more products as an indication that the participant has chosen to purchase the one or more products in the virtual reality simulation.

11. The non-transitory computer-readable storage medium of claim 8, further comprising providing haptic feedback to the user in response to the touching records.

12. The non-transitory computer-readable storage medium of claim 8, wherein the set of simulation data includes an indication of consumer product preferences provided by the participant, and wherein the one or more smart objects are generated in response to the consumer product preferences of the participant.

13. The non-transitory computer-readable storage medium of claim 8, wherein the virtual reality display platform includes an instrumented device from which user input is received, and wherein the on the one or more touch screen display devices are configured to display images that simulate navigating through the shopping environment based on the user input.

14. The non-transitory computer-readable storage medium of claim 13, wherein the instrumented device comprises a physical handle configured to simulate an appearance and function of at least a portion of a shopping cart.

15. A system, comprising:
at least one computing device;
a virtual reality display platform comprising:
  an instrumented device; and
  one or more touch screen display devices; and
a memory storing a virtual reality program, wherein, when executed by the at least one computing device, the virtual reality program is configured to cause the at least one computing device to:
  receive a set of simulation data describing a shopping environment to represent in the virtual reality simulation,
  generate, from the set of simulation data, one or more smart objects, wherein each smart object is a virtual representation of an object in the shopping environment,
  generate a virtual reality simulation that includes the one or more smart objects,
  present the virtual reality simulation to the simulation participant on the one or more touch screen display devices of the virtual reality display platform,
  each time the participant touches the one or more touch screen display devices on an area in which one of the smart objects is displayed, generate a touching record indicating that the participant touched the respective one of the smart objects, and
  store each generated touching record,
wherein instrumented device is configured to receive user input and the one or more touch screen display devices are configured to display images that simulate navigating through the shopping environment based on the user input.

16. The system of claim 15, wherein each smart object represents one of a floor, a shelf, a sign, and a product within the shopping environment.

17. The system of claim 15, wherein the set of simulation data includes an indication of consumer product preferences provided by the participant, and wherein the one or more smart objects are generated in response to the consumer product preferences of the participant.

18. The system of claim 15, wherein one or more of the smart objects comprises a virtual representation of one or more products, and wherein the method further comprises interpreting touching records generated in response to touching associated with the one or more products as an indication that the participant has chosen to purchase the one or more products in the virtual reality simulation.

19. The system of claim 15, wherein the instrumented device comprises a physical handle configured to simulate an appearance and function of at least a portion of a shopping cart.

20. The method of claim 15, wherein the touching record comprises an indication that the participant chose to purchase the respective one of the smart objects, and wherein storing the touching record comprises storing the indication that the participant chose to purchase the respective one of the smart objects.

* * * * *